United States Patent
Alpert et al.

(10) Patent No.: US 7,624,366 B2
(45) Date of Patent: Nov. 24, 2009

(54) CLOCK AWARE PLACEMENT

(75) Inventors: Charles J. Alpert, Cedar Park, TX (US); David J. Hathaway, Underhill, VT (US); William R. Migatz, Wappingers Falls, NY (US); Gi-Joon Nam, Austin, TX (US); Haoxing Ren, Austin, TX (US); Paul G. Villarrubia, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 402 days.

(21) Appl. No.: 11/554,637

(22) Filed: Oct. 31, 2006

(65) Prior Publication Data

US 2008/0127018 A1    May 29, 2008

(51) Int. Cl.
G06F 17/50   (2006.01)
(52) U.S. Cl. .................................................. 716/10
(58) Field of Classification Search .................. 716/10
See application file for complete search history.

(56) References Cited

U.S. PATENT DOCUMENTS 5,917,729 A * 6/1999 Naganuma et al. ............ 716/10
6,182,269 B1 * 1/2001 Laubhan ........................ 716/5
6,536,024 B1   3/2003 Hathaway
7,024,636 B2 * 4/2006 Weed ............................ 716/1

OTHER PUBLICATIONS

Viswanathan et al., "FastPlace: Efficient Analytical Placement using CellShifting, Iterative Local Refinement and a Hybrid Net Model", ISPD'04, Apr. 18-21, 2004, Phoenix, Arizona, USA. Copyright 2004 ACM 1-58113-817-02/04/0004.*
Y. Lu et al., "Navigating Registers in Placement for Clock Network Minimization," ACM proceedings (DAC) pp. 176-181 (2005).

* cited by examiner

*Primary Examiner*—Jack Chiang
*Assistant Examiner*—Brandon W Bowers
(74) *Attorney, Agent, or Firm*—Libby Z. Handelsman; Jack V. Musgrove

(57) ABSTRACT

The layout of latches in a common clock domain is efficiently optimized to shrink the physical size of the domain while maintaining timing requirements. The latches are placed in a first layout preferably using quadratic placement, and a star object is built representing an interim clock structure. The latches are weighted based on wire distance from a source of the star object, and then re-placed using the weighting. The weighted placement and repartitioning may be iteratively repeated until a target number of bins is reached. The boundary of the latches in the final global placement is used to define a movebound for further detailed placement.

34 Claims, 5 Drawing Sheets

CLOCK AWARE PLACEMENT

BACKGROUND OF THE INVENTION

1. Field of the Invention

The present invention generally relates to the fabrication and design of semiconductor chips and integrated circuits, and more particularly to a method of designing the physical layout (placement) of latches in a net having a common clock domain.

2. Description of the Related Art

Integrated circuits are used for a wide variety of electronic applications, from simple devices such as wristwatches to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The process of converting the specifications of an electrical circuit into a layout is called the physical design.

Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA) including Verilog, VHDL and TDML. A typical EDA system receives one or more high level behavioral descriptions of an IC device, and translates this high level design language description into netlists of various levels of abstraction.

Placement algorithms are typically based on either a simulated annealing, top-down cut-based partitioning, or analytical paradigm (or some combination thereof). Recent years have seen the emergence of several new academic placement tools, especially in the top-down partitioning and analytical domains. The advent of multilevel partitioning as a fast and extremely effective algorithm for min-cut partitioning has helped spawn a new generation of top-down cut-based placers. A placer in this class partitions the cells into either two (bisection) or four (quadrisection) regions of the chip, then recursively partitions each region until a global (coarse) placement is achieved. Analytical placers may allow cells to temporarily overlap in a design. Legalization is achieved by removing overlaps via either partitioning or by introducing additional forces and/or constraints to generate a new optimization problem. The classic analytical placers, PROUD and GORDIAN, both iteratively use bipartitioning techniques to remove overlaps. Eisenmann's force-based placer uses additional forces besides the well-known wire length dependent forces to reduce cell overlaps and to consider the placement area. Analytical placers optimally solve a relaxed placement formulation, such as minimizing total quadratic wire length. Quadratic placers generally use various numerical optimization techniques to solve a linear system. Two popular techniques are known as conjugate gradient (CG) and successive over-relaxation (SOR). The PROUD placer uses the SOR technique, while the GORDIAN placer employs the CG algorithm.

While these techniques provide adequate placement of cells with regard to their data interconnections, there is an additional challenge for the designer in constructing a clock network for the cells and this challenge is becoming more difficult with the latest technologies like low-power, 65-nanometer integrated circuits. FIG. 1 illustrates a typical clock tree for a net of clock sinks such as latches 2 in a common clock domain that have been placed using conventional techniques. The clocking source 4 (e.g., an oscillator signal or a gating signal used to gate a clock) is located in a centralized area of the latches and branches out to multiple buffers 6 which are further connected to other buffers 8 or clusters of latches 2. Placement algorithms have a tendency to spread out the latches, creating a relatively large clock domain size which is undesirable since a larger clock domain can result in increased power consumption and lead to problems caused by variations in the delays to various clock sinks of paths originating at source 4. There are additional advantages of having a smaller clock domain size such as a smaller number of clock buffers and shorter clock wires leading to smaller clock tree latency, and less clock skew.

The traditional approach to clock tree construction relies on movebounds to simply constrain the placement of domains. This approach, however, is cumbersome and cannot produce optimal results due to overly restrictive constraints. It can also be difficult to predict where to place the domains. An alternative approach creates an artificial net connecting all latches in the same domain, but it is difficult to control the degree of attraction imposed by the artificial net which leads to poor wirelength, congestion and timing. A third approach is to interleave clock tree construction with placement as taught in U.S. Pat. No. 6,536,024. While this method provides some optimization of clock power, it is hard to properly represent clock tree structures in placement engines which leads to an undue amount of runtime overhead.

In light of the foregoing, it would be desirable to devise an improved placement method which could take clock tree construction into consideration to reduce the clock domain size without requiring excess runtime. It would be further advantageous if the method could optimize signal paths for timing closure without imposing severe design constraints.

SUMMARY OF THE INVENTION

It is therefore one object of the present invention to provide an improved placement method for designing the layout of an integrated circuit which takes the clock network into consideration and places sinks belonging to the same clock domain closer without sacrificing timing requirements.

It is another object of the present invention to provide such a method which does not impose unnecessary design constraints during placement yet can be efficiently carried out on a data processing system.

It is still another object of the present invention to provide a method for designing the layout of latches in a common clock domain which may advantageously utilize features of existing placement techniques such as quadratic placement.

The foregoing objects are achieved in a method of designing a layout for a plurality of latches in a common clock domain of an integrated circuit by placing the latches in a first layout, building a star object for the latches, weighting the latches based on wire distance from a source of the star object, and re-placing the latches in a second layout using the latch weighting. The latches are preferably located using quadratic placement and the weighting is preferably an exponential function of the wire distance. The source of the star object is located at a geometric center of the latches in the first layout and includes a plurality of splitters (buffers) which fan out to latches grouped in a cluster. The first layout has a first partition for a region of the integrated circuit which is repartitioned for the second layout. The weighted placement and repartitioning may be iteratively repeated until a target number of bins is reached. Any outlier latches are directly moved into a physical domain defined by a boundary of the remaining latches. This boundary, based on maximum and minimum coordinates of the latches in the second layout, is used to define a movebound for further detailed placement.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 2:
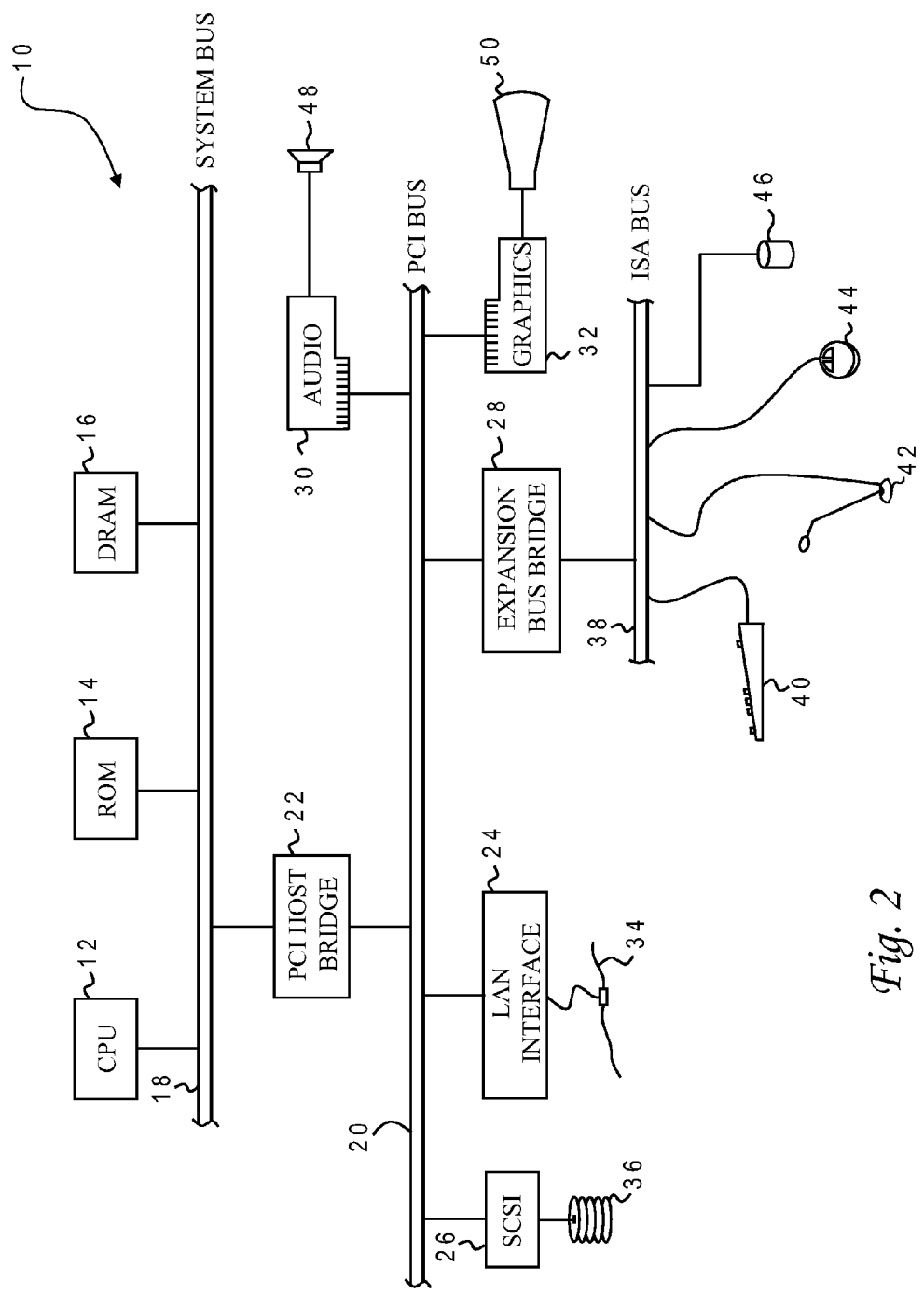
FIG. 2 is a block diagram of a computer system programmed to carry out computer-aided design of an integrated circuit in accordance with one implementation of the present invention.

With reference now to the figures, and in particular with reference to FIG. 2, there is depicted one embodiment 10 of a computer system programmed to carry out computer-aided design of an integrated circuit in accordance with one implementation of the present invention. System 10 includes a central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There may be additional structures in the memory hierarchy which are not depicted, such as on-board (L1) and second-level (L2) caches. In high performance implementations, system 10 may include multiple CPUs and a distributed system memory.

CPU 12, ROM 14 and DRAM 16 are also coupled to a peripheral component interconnect (PCI) local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state, including the program which embodies the present invention as explained further below. Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44. Other devices may also be attached to ISA bus 38, such as a CD-ROM drive 46. Audio adapter 30 controls audio output to a speaker 48, and graphics adapter 32 controls visual output to a display monitor 50, to allow the user to carry out the integrated circuit design as taught herein.

While the illustrative implementation provides the program instructions embodying the present invention on disk drive 36, those skilled in the art will appreciate that the invention can be embodied in a program product utilizing other computer-readable media, including transmission media.

Computer system 10 carries out program instructions for placement of clock sinks (e.g., latches) in the design of an integrated circuit using a novel technique wherein the sinks are first laid out using a placement algorithm such as quadratic placement, a star object is built for clusters of the latches, and a weighting is assigned to the latches based on wire distance from a center of the star object. The sinks are then re-placed using the latch weighting. Accordingly, a program embodying the invention may include conventional aspects of various quadratic optimizers and cut-based partitioners, and these details will become apparent to those skilled in the art upon reference to this disclosure.

With further reference to FIGS. 3A-3E, in one embodiment computer system 10 begins the design process by locating latches 60 of a common clock domain in a partition 62 of a region of the integrated circuit using quadratic placement. Other placement techniques may be used but quadratic placement is deemed preferable since it often produces better results than alternatives such as min-cut based placement. The quadratic placement portion of the process solves the linear system Ax=b where A is an optimization matrix, and x and b are vectors. During quadratic placement, cells are recursively partitioned into smaller bins. Quadratic placement may be applied to collections of cells, rather than individual cells, as further described in U.S. patent application Ser. No. 10/996,293 filed Nov. 22, 2004, which is hereby incorporated. In this simplified example, there are four clusters of latches 60 with three latches in each cluster, and the final partition 62 has 12 bins (4×3). Those skilled in the art will appreciate that practical applications of the invention may involve hundreds or thousands of clock sinks with much larger partitions, and although these clock sinks are referred to herein as latches that term includes devices such as flip-flops, dynamic logic circuits, or any combination of these and other clocked circuit elements.

Figure 1:
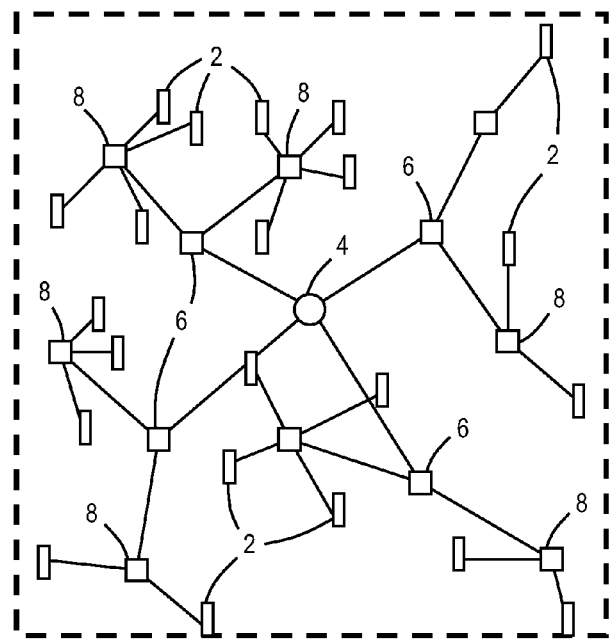
FIG. 1 is a plan view of a conventional layout of latches in a common clock domain showing a buffered clock tree.
Figure 3A:
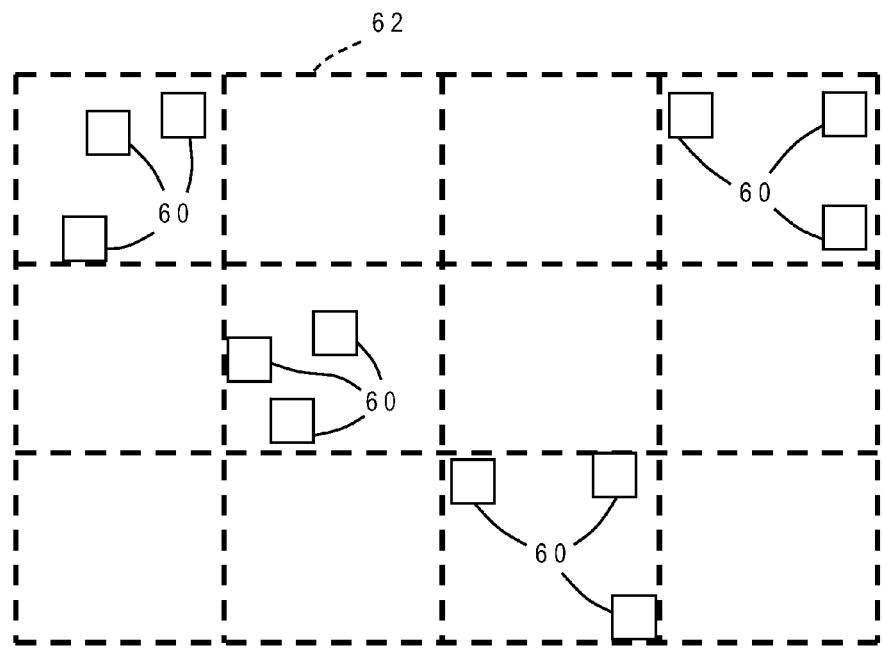
FIG. 3A is a plan view of latches in a common clock domain located by quadratic placement, in an initial layout that is further modified in accordance with one implementation of the present invention.

The input data for clock aware placement according to the present invention includes clock domain information. Prior to quadratic placement, the design is clock traced to assign latches to their domain group. The input data also includes gating source information for the domain group. The first layout shown in FIG. 3A provides an initial estimate of the latch locations which is then refined to place latches belonging to the same clock domain closer, without sacrificing timing requirements. The present invention proceeds on the notion that if any latches are already placed relatively close to each other then it is unnecessary to put any constraint on them, and the refinement needs to move only those latches that are far away, bringing them closer to the general center without moving latches already placed near the center. This scheme may be carried out by applying different constraints on latches that are either loosely clustered or relatively far away from the clock (gating source).

Figure 3B:
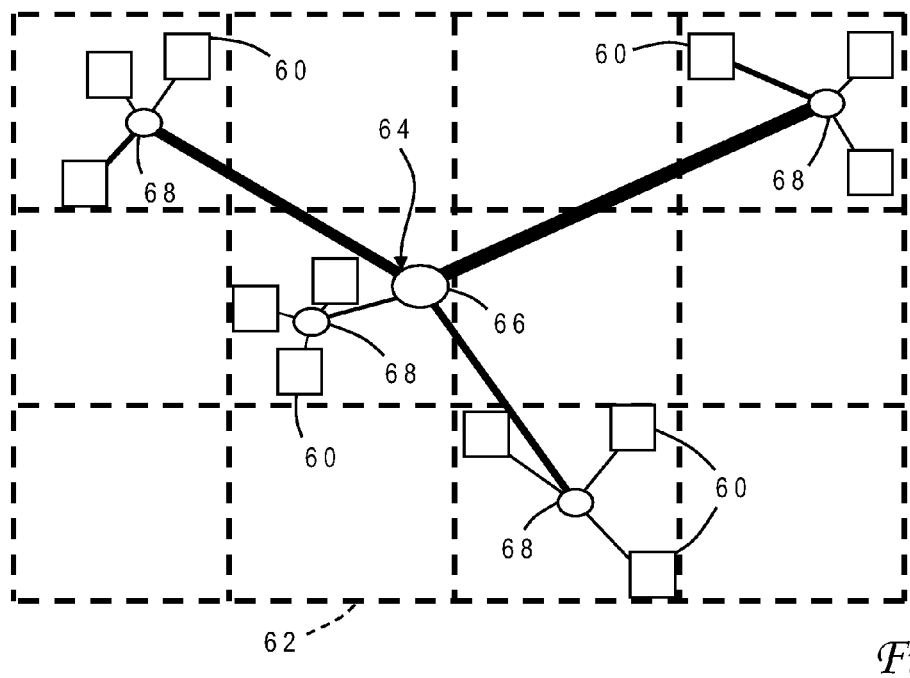
FIG. 3B is a plan view of the initial layout of FIG. 3A with a star object inserted representing an interim clock structure which is used to assign weighting to the latches in accordance with one implementation of the present invention.

This technique is quantitatively implemented by first constructing a star object 64 for the latches which represents an interim clock structure, as shown in FIG. 3B. Star object 64 has a virtual source 66 lying at the geometric center of latches 60, and buffers 68 which fan out to latches in a cluster. Buffers 68 are located at the respective geometric centers of the latch clusters. Buffers 68 may represent actual buffers, clock splitters, or other clock tree elements, or may be abstract nodes that do not represent any actual clock tree elements and are used only to force the clustering of the latches 60 to which they are connected. Star object 64 is in effect composed of subsidiary star objects at each latch cluster, and other implementations may have more than these two illustrated levels of star objects, particularly between subsequent placement iterations.

Each edge of star object 64 is assigned a different weighting according to its root or branch length, i.e., the weight increases with the distance from virtual center 64 to a buffer 68 or with the distance from a buffer 68 to a latch 60. These weightings are graphically illustrated in FIG. 3B by the different edge widths. The weighting is preferably an exponential function of the wire distance. A given latch has a resulting weight based on the sum of the edge widths (wire distances) leading from virtual source 64 to that latch. The longest latch distance can be used as a normalizing factor. Latches near the center will have lower weight and latches closer to the bounding box of partition 62 have higher weight. This weighting is applied to wirelength as a multiplicative factor in a subsequent placement of the latches. By assigning different weights to each edge, the invention can effectively shrink the bounding box of the domain without constraining the latch placement unnecessarily.

Figure 3C:
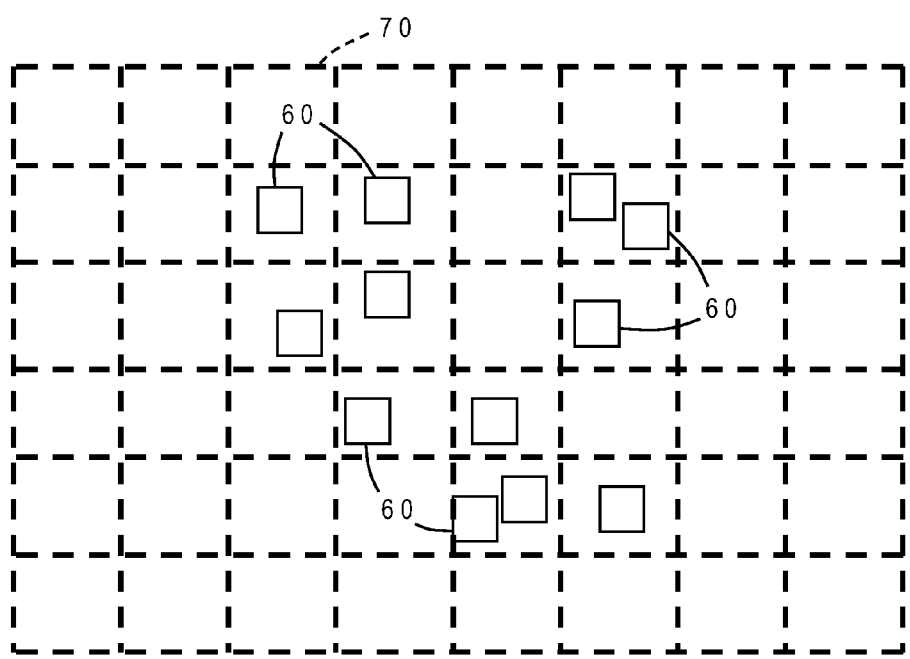
FIG. 3C is a plan view of the latches in a modified layout after relocation by partitioning/repartitioning using the assigned latch weighting.

FIG. 3C illustrates a second layout for the twelve latches 60 after partitioning/repartitioning and further quadratic placement using the foregoing latch weighting without clustering. In this example the final partition 70 for this layout has 48 bins (8×6). As can be seen, the latches are all generally placed closer to the center after the second quadratic solution. This approach is particularly stable because it uses the first placement (FIG. 3A) as a baseline and adds additional forces to shrink the size of each cluster.

Depending upon the particular placer used and the nuances of the latch net, there may be some latches in the common clock domain that are placed far outside the bounds defined by the vast majority of the latches. These outlier latches are often placed away from the remaining latches because of interconnections with cells in other domains. If there are any outlier latches after the second quadratic solution they may be directly moved into the physical domain, at the closest location just within the boundary defined by the remaining latches. A latch can be designated as outlier based on different criteria. If a latch is in a bin of the final partition which is adjacent to only empty bins, i.e., there are no latches in the adjacent bins, then it is probably an outlier latch. A formulaic approach may also be carried out automatically by computer system 10 which determines a cutoff distance from the center of the domain, for example a distance of $3\sigma$ (three standard deviations of the latch distribution).

Figure 3D:
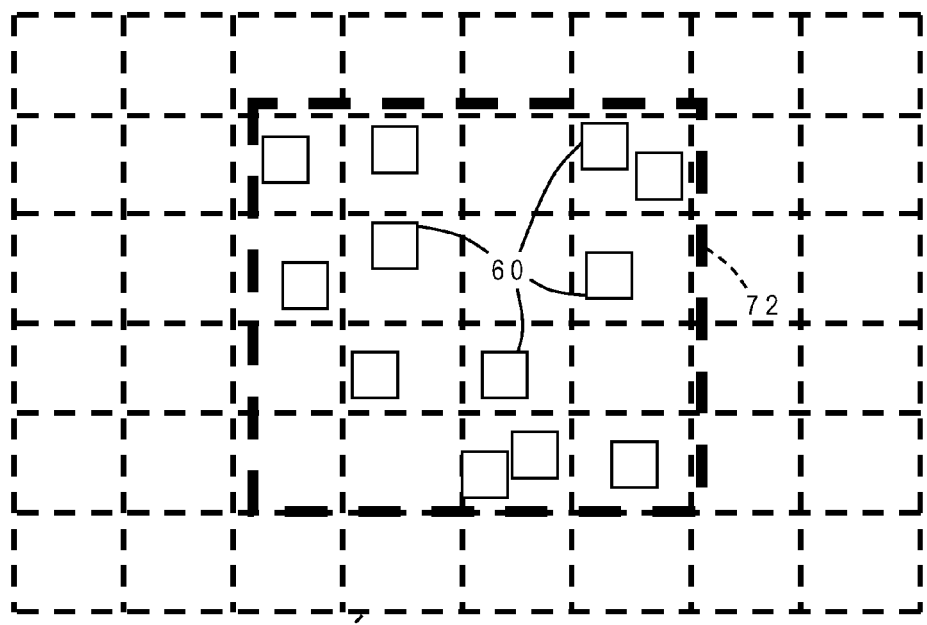
FIG. 3D is a plan view of the modified layout of FIG. 3C illustrating the creation of a movebound surrounding the latches.
Figure 3E:
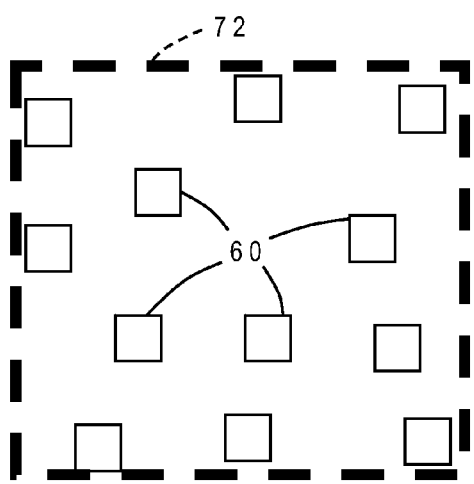
FIG. 3E is a plan view of the latches after detailed placement using the movebound from FIG. 3D.

Once the latches have been re-placed into the smaller domain, a new boundary or movebound 72 is established for further placement steps as seen in FIG. 3D. A rectangular movebound may be defined using the maximum and minimum coordinates (e.g., x and y coordinates) of the re-placed latches. Although shown in FIG. 3D as a rectangle, the movebound may take on other forms such as a collection of connected rectangles or an arbitrary polygon. The process preferably continues using a min-cut placer such as GORDIAN, followed by detailed placement within the new movebound 72. To prevent min-cut placement from moving latches in the common clock domain, the locations of those latches are fixed for the min-cut placement step. The detailed placement step moves cells around to further reduce wirelength. FIG. 3E shows the twelve latches 60 within movebound 72 after detailed placement in their final locations. Detailed placement is heuristic, and may be performed using a placer such as TIMBERWOLF. A clock tree may thereafter be constructed for the latch layout of FIG. 3E using conventional methods.

Figure 4:
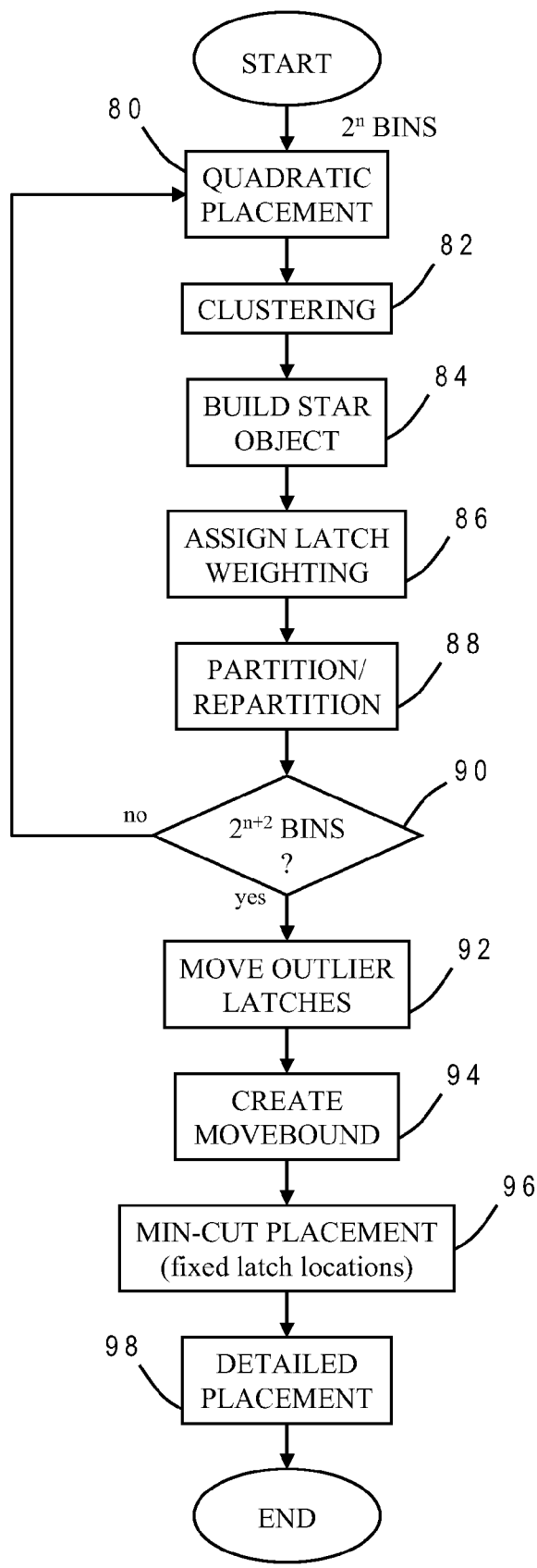
FIG. 4 is a chart illustrating the logical flow for clock aware placement of latches in accordance with one implementation of the present invention.

The present invention may be further understood with reference to the flow chart of FIG. 4. In the illustrative implementation, the process begins with quadratic placement of the clock sinks (80). Clusters of the sinks are then defined (82), and the star object is built from the center of the sinks branching out to the clusters (84). The wire lengths in the star object are then used to assign weights to the sinks (86). The latches are again placed with one or more rounds of partitioning using the weighting (88). All of these steps may be repeated iteratively until a target number of bins is reached for the final partition (90). The number of bins in the final partition may be $2^{n+2}$, where the initial number of bins at the start of the process is expressed at $2^n$. For example, if the starting number of bins is four (n=2), the ending number of bins will be sixteen. If the number of bins is less than the prescribed number, the process returns to step 80. Otherwise global placement is considered complete and the process continues by moving any outlier sinks toward the center of the clock domain (92). The new movebound is then defined (94) and the sink locations are temporarily fixed for min-cut placement (96). The sinks are finally located within the movebound using detailed placement (98).

The invention thus provides an efficient method for shrinking the domain size for a set of latches in a common clock domain. The process is particularly advantageous since it does not require clock tree synthesis during placement which can lead to excess runtime, especially where multiple domains are involved. The smaller clock domain will require less power and better yields. Experimental results further show that the significant improvement in domain size does not adversely affect either timing or wirelength results. The process can also be latch density aware, where latches are only clustered when the density is below a user-defined threshold. Compared to traditional approaches, the present invention imposes fewer design constraints while still providing superior solutions. The invention is applicable to any type of clock domain, including regular clock domains, gated clock domains, or virtual macro (VMAC) clock domains.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, the invention is not limited to use with quadratic placement, and the latch clustering, weighting, outlier removal and movebound scheme can be applied to other placement algorithms such as nonlinear optimization, force-directed, min-cut and simulated annealing. It is therefore contemplated that such modifications can be made without departing from the spirit or scope of the present invention as defined in the appended claims.

What is claimed is:

1. A computer-implemented method of designing a layout for a plurality of latches in a common clock domain of an integrated circuit, comprising:
   placing the latches in a first layout by executing first instructions on a computer system;
   building at least one star object for the latches in the first layout by executing second instructions on the computer system, the star object representing an interim clock structure for the clock domain;
   weighting the latches based on wire distance from a source of the star object by executing third instructions on the computer system; and
   placing the latches in a second layout using the latch weighting by executing fourth instructions on the computer system.

2. The method of claim 1 wherein said placing of the latches in the first and second layouts is carried out by quadratic placement.

3. The method of claim 1 wherein at least one of the latches is an outlier latch placed away from remaining latches, and further comprising directly moving the outlier latch into a physical domain defined by a boundary of the remaining latches by executing fifth instructions on the computer system.

4. The method of claim 1 wherein said weighting is an exponential function of the wire distance.

5. The method of claim 1 wherein the first layout has a first partition for a region of the integrated circuit, and further comprising repartitioning the region into a second partition for the second layout by executing fifth instructions on the computer system.

6. The method of claim 5 wherein said placing of the latches in the first layout, said building of the star object, said repartitioning of the region, and said placing of the latches in the second layout are iteratively repeated until a target number of bins is reached.

7. The method of claim 1, further comprising forming a movebound for the latches in the second layout by executing fifth instructions on the computer system.

8. The method of claim 7, further comprising placing the latches in a third layout within the movebound using detailed placement by executing fifth instructions on the computer system.

9. The method of claim 1 wherein the source of the star object is located at a geometric center of the latches in the first layout.

10. The method of claim 9 wherein the latches are grouped into clusters in the first layout, and the star object includes a plurality of splitters which fan out to latches in a cluster.

11. A computer system comprising:
   one or more processors which process program instructions;
   a memory device connected to said one or more processors; and
   program instructions residing in said memory device for designing a layout of a plurality of latches in a common clock domain of an integrated circuit by placing the latches in a first layout, building at least one star object for the latches in the first layout wherein the star object represents an interim clock structure for the clock domain, weighting the latches based on wire distance from a source of the star object, and placing the latches in a second layout using the latch weighting.

12. The computer system of claim 11 wherein the placing of the latches in the first and second layouts is carried out by quadratic placement.

13. The computer system of claim 11 wherein at least one of the latches is an outlier latch placed away from remaining latches, and said program instructions further directly move the outlier latch into a physical domain defined by a boundary of the remaining latches.

14. The computer system of claim 11 wherein the weighting is an exponential function of the wire distance.

15. The computer system of claim 11 wherein the first layout has a first partition for a region of the integrated circuit, and said program instructions further repartition the region into a second partition for the second layout.

16. The computer system of claim 15 wherein the placing of the latches in the first layout, the building of the star object, the repartitioning of the region, and the placing of the latches in the second layout are iteratively repeated until a target number of bins is reached.

17. The computer system of claim 11 wherein said program instructions further form a movebound for the latches in the second layout.

18. The computer system of claim 17 wherein said program instructions further place the latches in a third layout within the movebound using detailed placement.

19. The computer system of claim 11 wherein the source of the star object is located at a geometric center of the latches in the first layout.

20. The computer system of claim 19 wherein the latches are grouped into clusters in the first layout, and the star object includes a plurality of splitters which fan out to latches in a cluster.

21. A computer program product comprising:
a computer-readable medium; and
program instructions residing in said medium for designing a layout of a plurality of latches in a common clock domain of an integrated circuit by placing the latches in a first layout, building at least one star object for the latches in the first layout wherein the star object represents an interim clock structure for the clock domain, weighting the latches based on wire distance from a source of the star object, and placing the latches in a second layout using the latch weighting.

22. The computer program product of claim 21 wherein the placing of the latches in the first and second layouts is carried out by quadratic placement.

23. The computer program product of claim 21 wherein at least one of the latches is an outlier latch placed away from remaining latches, and said program instructions further directly move the outlier latch into a physical domain defined by a boundary of the remaining latches.

24. The computer program product of claim 21 wherein the weighting is an exponential function of the wire distance.

25. The computer program product of claim 21 wherein the first layout has a first partition for a region of the integrated circuit, and said program instructions further repartition the region into a second partition for the second layout.

26. The computer program product of claim 25 wherein said program instructions iteratively repeat the placing of the latches in the first layout, the building of the star object, the repartitioning of the region, and the placing of the latches in the second layout until a target number of bins is reached.

27. The computer program product of claim 21 wherein said program instructions further form a movebound for the latches in the second layout.

28. The computer program product of claim 27 wherein said program instructions further place the latches in a third layout within the movebound using detailed placement.

29. The computer program product of claim 21 wherein the source of the star object is located at a geometric center of the latches in the first layout.

30. The computer program product of claim 29 wherein the latches are grouped into clusters in the first layout, and the star object includes a plurality of splitters which fan out to latches in a cluster.

31. A computer program product comprising:
a computer-readable medium; and
program instructions residing in said medium for designing a layout of a plurality of latches in a common clock domain of an integrated circuit by:
partitioning a region of the integrated circuit to define a first partition,
placing the latches in a first layout with the first partition,
grouping latches in the first layout into clusters,
building at least one star object having a source located at a geometric center of the latches in the first layout and a plurality of splitters which fan out to latches in a cluster,
weighting the latches based on wire distance from the source of the star object,
repartitioning the region to define a second partition having more bins that the first partition,
re-placing the latches in a second layout with the second partition using the latch weighting,
forming a movebound for the latches in the second layout, and
locating the latches in a third layout within the movebound using detailed placement.

32. The computer program product of claim 31 wherein said placing of the latches in the first and second layouts is carried out by quadratic placement.

33. The computer program product of claim 31 wherein said weighting is an exponential function of the wire distance.

34. The computer program product of claim 31 wherein said program instructions iteratively repeat the placing, grouping, building, weighting, repartitioning, and re-placing until a target number of bins is reached.

* * * * *